United States Patent [19]
Juang et al.

[11] Patent Number: 5,547,882
[45] Date of Patent: Aug. 20, 1996

[54] METHOD FOR FORMING RETROGRADE CHANNEL PROFILE BY PHOSPHORUS IMPLANTATION THROUGH POLYSILICON GATE

[75] Inventors: Miin-Horng Juang, Ping-Tung; San-Jung Chang, Chang-Hua; Chin-Hsien Wang, Hsin-Chu, all of Taiwan

[73] Assignee: Mosel Vitelic Inc., Hsinchu, Taiwan

[21] Appl. No.: 540,774

[22] Filed: Oct. 11, 1995

[51] Int. Cl.$^6$ ................................ H01L 21/266
[52] U.S. Cl. .................... 437/40; 437/30; 437/45
[58] Field of Search ................... 437/30, 40 GS, 437/45, 931, 984

[56] References Cited

U.S. PATENT DOCUMENTS

| | | | |
|---|---|---|---|
| 4,402,761 | 9/1983 | Feist | 437/45 |
| 4,578,128 | 3/1986 | Mundt et al. | 437/67 |
| 5,141,882 | 8/1992 | Komori et al. | 437/45 |
| 5,422,301 | 6/1995 | Otsuki | 437/45 |

*Primary Examiner*—Chandra Chaudhari
*Attorney, Agent, or Firm*—Brumbaugh, Graves, Donohue & Raymond

[57] ABSTRACT

A method for forming retrograde semiconductor substrate channel impurities profile of a semiconductor device by using phosphorus ions implantation, includes the steps of forming a sacrificial oxide layer on a semiconductor substrate, ion-implanting boron ions to adjust threshold voltage of the device, removing the sacrificial oxide layer, forming a gate oxide layer on the semiconductor substrate, depositing a gate polysilicon layer on the gate oxide layer, forming a gate by etching the gate polysilicon layer, ion-implanting firstly by implanting phosphorus ions to form lightly doped drain regions, and ion-implanting secondly by implanting phosphorus ions into the semiconductor substrate channel to form retrograde channel impurities profile as well as to achieve proper threshold voltage.

6 Claims, 3 Drawing Sheets

5,547,882

METHOD FOR FORMING RETROGRADE CHANNEL PROFILE BY PHOSPHORUS IMPLANTATION THROUGH POLYSILICON GATE

FIELD OF THE INVENTION

The present invention relates to a method for forming retrograde channel impurities profile, especially to a method for forming the retrograde semiconductor substrate channel impurities profile by using the phosphorus ions implantation through polysilicon gate into the substrate channel. Hence, the semiconductor device could have good anti-punch-through characteristics and retain better device performance.

BACKGROUND OF THE INVENTION

Currently, threshold voltage adjust implantation is used to properly design MOSFETs. For an example, the NMOS with N+ type polysilicon gate is often formed by adequate boron ions implantation so as to adjust threshold voltage.

FIG. 1. shows the conventional channel profile diagram of a semiconductor device by merely using the boron ions implantation. As shown in FIG. 1, the final distribution of channel profile would show decreased boron concentration with increased channel depth.

However, while the channel depth increases, boron concentration decreases dramatically in the channel. Besides, higher surface channel concentration would degrade the effective electron mobility.

FIG. 2 shows Id vs. Vg diagram for a semiconductor device with the conventional channel profile. As shown in FIG. 2, curve 21 corresponds to the condition while Vd=5V, and curve 22 corresponds to the condition while Vd=0.1V. As shown in curve 21 of FIG. 2, when the device is operated under the condition of Vd=5V and Vg=0, then Id, which is the off leakage current of the device element, is equal to 3.75 pA. The off leakage current is not small enough to provide immunization from punch through effect generally. Therefore, as long as the PN junction is not shallowlized by using advanced formation technology, the channel implantation should be considerably increased to prevent punch through leakage for scaled down channel length.

However, higher surface channel concentration would degrade the effective electron mobility and impact ionization as well. Hence, advanced channel profile is expected to improve the device scalability.

SUMMARY OF THE INVENTION

It is therefore an object of the present invention to eliminate the shortcomings of the conventional process which utilizes channel implantation for preventing punch through effect.

It is still another object of the present invention to improve the character of the semiconductor device by implanting phosphorus ions through polysilicon gate into the substrate channel to form retrograde channel profile.

The object of the present invention is fulfilled by providing a method for forming the retrograde semiconductor substrate channel impurities profile of a semiconductor device by using the phosphorus ions implantation. The method comprises the steps of, forming a sacrificial oxide layer on the semiconductor substrate, ion-implanting boron ions to adjust threshold voltage of the semiconductor device, removing the sacrificial oxide layer, forming a gate oxide layer on the semiconductor substrate, depositing a gate polysilicon layer on the gate oxide layer, forming a gate by etching the gate polysilicon layer, ion-implanting firstly by implanting phosphorus ions to form lightly doped drain regions, and ion-implanting secondly by implanting phosphorus ions into the semiconductor substrate channel which is located between the lightly doped drain regions to form retrograde channel impurities profile.

BRIEF DESCRIPTION OF THE DRAWING

The present invention will be more fully understood from the detailed description given hereinafter with reference to and the accompanying drawings which are given by way of illustration only, and thus are not limitative of the present invention and wherein.

DETAILED DESCRIPTION OF THE PREFERRED EMBODIMENT

In order to improve the punch-through immunity and achieve better device performance, the present invention discloses a process in which retrograde channel profile is executed easily by implanting phosphorus ions through polysilicon gate. The surface doping concentration is reduced, while the possible punch-through path below the surface channel is suppressed by higher channel doping. The present invention is available for deep submicron IC technology.

An embodiment of the present invention is applied to a semiconductor substrate as illustrated in FIGS. 3 to 6 and described hereinafter.

Figure 1:
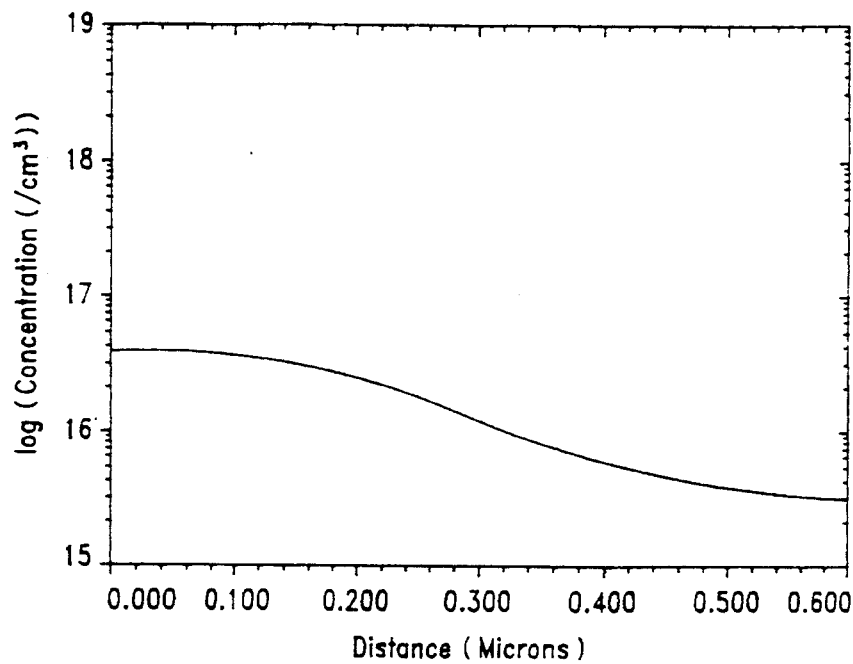
FIG. 1. shows the conventional channel profile diagram of a semiconductor device.
Figure 2:
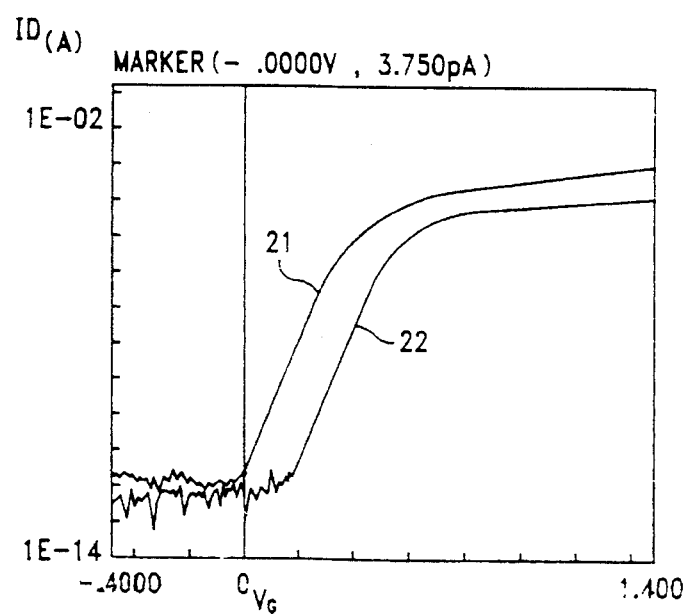
FIG. 2. shows the Id vs. Vg diagram for the semiconductor device with the conventional channel profile.
Figure 3:
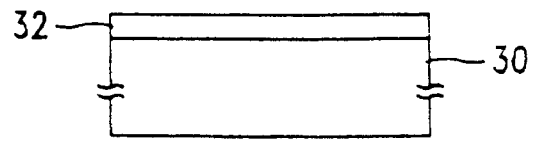
FIGS. 3 to 6 show cross-sectional views of the semiconductor device manufactured according to the present invention.

Turning to the drawings, FIG. 3 shows the first step is the formation of a sacrificial oxide layer 32 on the silicon substrate 30 by following the LOCOS (LOCal Oxidation of Silicon) process. The sacrificial oxide layer 32 has a thickness in the approximate range of 200–500 angstroms.

Figure 4:
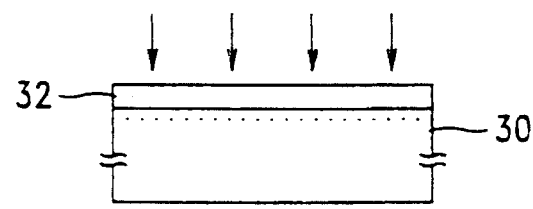

Then, as illustrated in FIG. 4, the second step is to implant boron ions into the silicon substrate 30 to adjust the threshold voltage of device.

Figure 5:
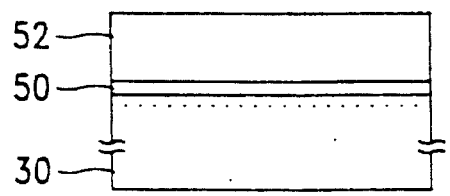

Consequently, referring to FIG. 5, the third step is to remove the sacrificial oxide layer 32 and the fourth step is to form a gate oxide layer 50 on the silicon substrate 30, the gate oxide layer 50 has a thickness in the approximate range of 100–300 angstroms here, but with gate oxide thickness being varied with device scaling. Thereafter, a gate polysilicon layer 52 is deposited on the gate oxide layer 50. The gate polysilicon layer 52 has a thickness in the approximate range of 2000–3000 angstroms.

Figure 6:
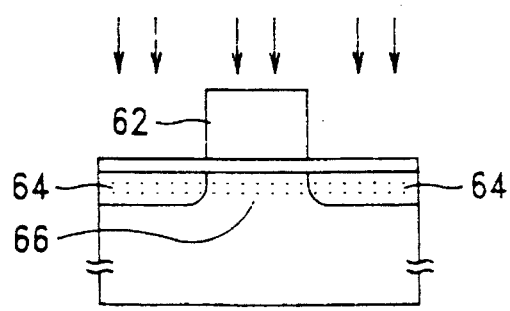

Next, referring to FIG. 6, the following step is to define the pattern of and etch the gate polysilicon layer 52 to form a gate 62, The N type LDD (Lightly Doped Drain) regions 64 are then formed by implanting phosphorus ions into the LDD regions 64. The ion implantation of N type LDD has a dosage preferably in the approximate range of 2E13 doses/cm² and an implant energy preferably in the approximate range of 30 Kev. Then, the second phosphorus ions implantation is performed to achieve the retrograde channel profile as well as to obtain proper threshold voltage. This is accomplished by implanting the phosphorus ions through the gate 62 into the channel 66, the ion implantation having a dosage preferably in the approximate range of 1.2E12 doses/cm² and an implant energy preferably in the approximate range of 170 Kev.

FIG. 6 shows the resulting structure after the key step of the present invention, namely, the phosphorus ions implantation for retrograde channel profile, is accomplished. In comparison with the conventional channel profile, the retrograde channel profile leads to better short channel effect behavior. Moreover, by using this technology, the source and drain junction can be deeper due to better punch through stop behavior than the conventional channel profile.

Figure 7:
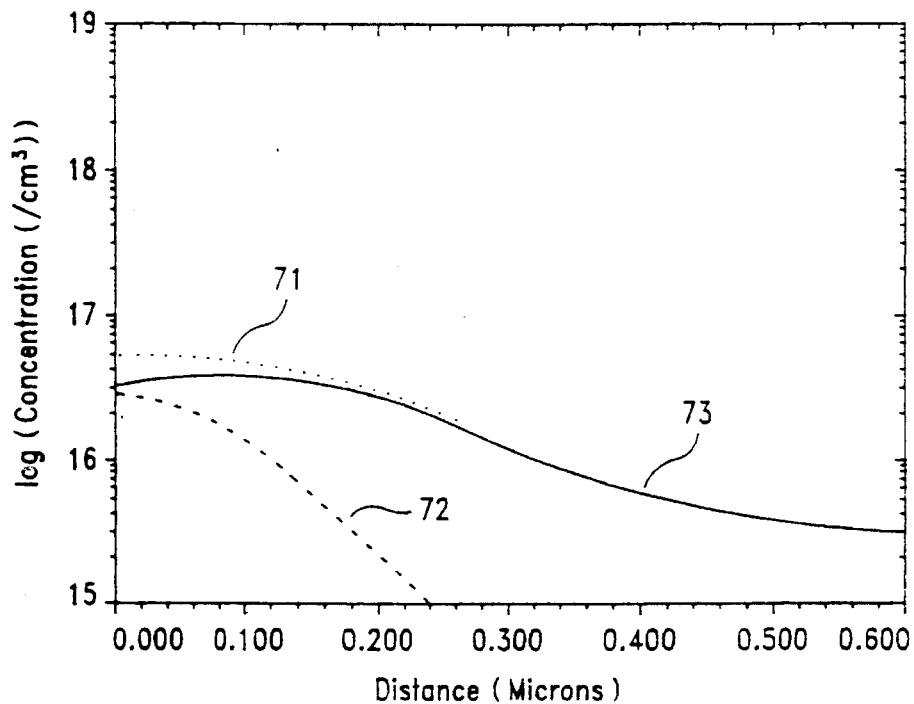
FIG. 7. shows the retrograde channel profile diagram of the semiconductor device manufactured according to the present invention.

Furthermore, referring to FIG. 7, which shows the retrograde channel profile presented by performing the technology according to the present invention, curve 71 shows the conventional channel profile of the semiconductor device by merely using the boron ions implantation, and curve 72 shows the channel profile by merely using the phosphorus ions implantation, the implanted phosphorus ions' concentration being smaller than the boron ions' concentration; so as to neutralize part of the boron ions, which are near the channel surface. An effective channel profile curve 73, which is more retrograde than curve 71, is obtained.

Figure 8:
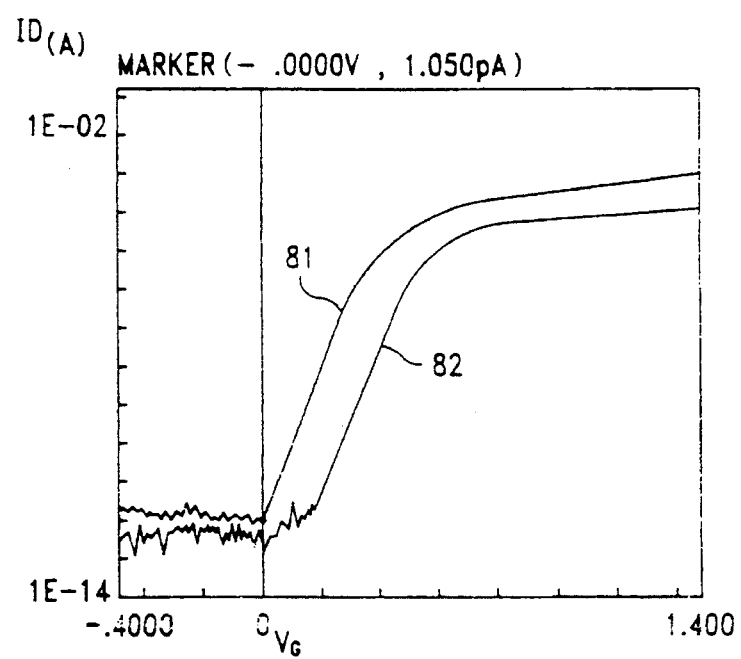
FIG. 8. shows the Id vs. Vg diagram for the semiconductor device manufactured according to the present invention.

Finally, referring to FIG. 8, which shows the Id vs. Vg diagram for the semiconductor device manufactured according to the present invention, curve 81 corresponds to the condition while Vd=5V, and curve 82 corresponds to the condition while Vd=0.1V. As shown in curve 81 of FIG. 8, when the device is operated under the condition of Vd=5V and Vg=0, then Id, which is the off leakage current of the device element manufactured according to the present invention, is equal to 1 pA, and is much smaller than 3.75 pA which is generated by the conventional device element (refer to the description in the foregoing), Thus, the device element manufactured according to the present invention has greater immunity from the punch through effect.

As stated above, it could be concluded that the key feature in the present invention is the phosphorus ions implantation for retrograde channel profile. By utilizing this process, the shortcoming generated by using the conventional process could be eliminated. Therefore, the semiconductor device could have good anti-punchthrough characteristics and achieve better device performance. Furthermore, this formation regime is processed easily and is available for sub- 0.5 μm process technology.

While the invention has been described by way of examples and in terms of the preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for forming retrograde semiconductor substrate channel impurities profile by using the phosphorus ions implantation, comprising:

forming a sacrificial oxide layer on said semiconductor substrate;

ion-implanting boron ions to adjust threshold voltage of the device;

removing said sacrificial oxide layer;

forming a gate oxide layer on said silicon substrate;

depositing a gate polysilicon layer on said gate oxide layer;

forming a gate by etching said gate polysilicon layer;

ion-implanting firstly by implanting phosphorus ions to form lightly doped drain regions;

ion-implanting secondly by implanting phosphorus ions into said semiconductor substrate channel which is located between said lightly doped drain regions to form said retrograde semiconductor substrate channel impurities profile as well as to achieve proper threshold voltage.

2. A method for forming retrograde semiconductor substrate channel impurities profile as in claim 1, wherein said sacrificial oxide layer has a thickness in the approximate range of 200–500 angstroms.

3. A method for forming retrograde semiconductor substrate channel impurities profile as in claim 1, wherein said gate oxide layer has a thickness in the approximate range of 100–300 angstroms.

4. A method for forming retrograde semiconductor substrate channel impurities profile as in claim 1, wherein said gate polysilicon layer has a thickness in the approximate range of 2000–3000 angstroms.

5. A method for forming retrograde semiconductor substrate channel impurities profile as in claim 1, wherein said lightly doped drain regions have an impurity concentration in the approximate range of 2E13/cm² and an implant energy in the range of 30 Kev.

6. A method for forming retrograde semiconductor substrate channel impurities profile as in claim 1, wherein said ion-implanting secondly by implanting phosphorus ions has a dosage in the range of 1.2E12/cm² and an implant energy in the range of 170 Kev.

\* \* \* \* \*